(12) United States Patent
Murowaki et al.

(10) Patent No.: US 6,280,205 B1
(45) Date of Patent: Aug. 28, 2001

(54) SURFACE-MOUNTED TYPE CONNECTOR AND METHOD FOR PRODUCING CIRCUIT DEVICE INCLUDING THE SAME

(75) Inventors: Toru Murowaki, Chiryu; Toshiaki Yagura, Nukata-gun; Minoru Hozuka, Okazaki, all of (JP)

(73) Assignee: Denso Corporation (JP)

( * ) Notice: Subject to any disclaimer, the term of this patent is extended or adjusted under 35 U.S.C. 154(b) by 0 days.

(21) Appl. No.: 09/517,511

(22) Filed: Mar. 2, 2000

(30) Foreign Application Priority Data

Mar. 16, 1999 (JP) .................................................. 11-070108
Oct. 20, 1999 (JP) .................................................. 11-298736

(51) Int. Cl.[7] .................................................. H01R 9/09
(52) U.S. Cl. .................................................. 439/79
(58) Field of Search .................................................. 439/79, 80, 83; 361/399

(56) References Cited

U.S. PATENT DOCUMENTS 4,885,126 * 12/1989 Polomio .................................. 361/399
5,605,477 * 2/1997 Wu et al. .................................. 439/79

FOREIGN PATENT DOCUMENTS

| 9-259955 | 10/1997 | (JP) . |
| 9-326269 | 12/1997 | (JP) . |
| 10-172620 | 6/1998 | (JP) . |
| 2-2792958 | 6/1998 | (JP) . |

* cited by examiner

Primary Examiner—Brian Sircus
Assistant Examiner—Phuong K T Dinh
(74) Attorney, Agent, or Firm—Nixon & Vanderhye PC

(57) ABSTRACT

A connector body has leg portions and lead terminals protruding therefrom. The lead terminals are fixed to a flexible member to be electrically connected to conductive paths on the flexible member. The flexible member has a free end portion, and the free end portion is soldered to the printed circuit board so that the conductive paths thereon are electrically connected to a wiring pattern on the printed circuit board. The free end portion has through holes and the leg portions of the connector body are inserted into the through holes. Accordingly, the positioning of the flexible member is performed readily and accurately, and reliability of soldered portion is improved.

19 Claims, 4 Drawing Sheets

SURFACE-MOUNTED TYPE CONNECTOR AND METHOD FOR PRODUCING CIRCUIT DEVICE INCLUDING THE SAME

CROSS REFERENCE TO RELATED APPLICATIONS

This application is based upon and claims the benefit of Japanese Patent Applications No. 11-70108 filed on Mar. 16, 1999, and No. 11-298736 filed on Oct. 20, 1999, the contents of which are incorporated herein by reference.

BACKGROUND OF THE INVENTION

1. Field of the Invention

This invention relates to a surface-mounted type connector and to a method for producing a circuit device including the surface-mounted type connector, which is generally used for an automotive electronic control unit.

2. Description of the Related Art

There are various kinds of structures for surface-mounting connectors used for electronic control units. For example, JP-A-9-326269 discloses a structure (a) in which a connector terminal is soldered to a printed circuit board by solder paste disposed between the printed circuit board and the connector terminal. JP-A-10-172620 discloses a structure (b) in which a connector terminal holding solder balls thereon undergoes a reflow treatment and is soldered to a printed circuit board by the solder balls. JP 2792958 discloses a structure (c) in which a connector terminal is connected to a printed circuit board by soldering through a flexible member.

In the structures (a) and (b), however, the connector terminal is mounted on the printed circuit board directly by soldering. Therefore, the soldered portions directly receive stresses generated such as when an opposite connector is attached or detached and when vibrations occur. As a result, the soldered portions may be separated from each other. In the structure (c), it is difficult to accurately position the flexible member with respect to the printed circuit board, and to keep the state of the positioned flexible member for soldering due to its flexibility.

SUMMARY OF THE INVENTION

The present invention has been made in view of the above problems. An object of the present invention is to provide a surface-mounted type connector capable of being mounted on a printed circuit board with high mounting workability and high reliability of soldered portions. Another object of the present invention is to provide a method for producing a circuit device including the surface-mounted type connector with high mounting workability and high reliability of soldered portions.

According to a first aspect of the present invention, a lead terminal protruding from a connector body is fixed to a flexible member and is electrically connected to a conductive path on the flexible member. The flexible member has a specific portion for being soldered to a member such as a printed circuit board. The specific portion has a through hole, and an extending portion protruding from the connector body is inserted into the through hole.

According to a second aspect of the present invention, a circuit device is produced as follows. Specifically, a lead terminal of a connector body is fixed to a first portion of a flexible member so that the lead terminal is electrically connected to a conductive path on the first portion. The flexible member has a second portion extending from the first portion and having a through hole, and an extending portion extending from the connector body is inserted into the through hole. Then, the connector body is fixed to a printed circuit board, and the conductive path on the flexible member is electrically connected to a wiring pattern on the printed circuit board.

Accordingly to the present invention described above, the flexible member can be positioned readily and accurately by inserting the extending portion of the connector body into the through hole of the flexible member. The mounting workability for mounting the connector body to the printed circuit board can be improved. Further, the wiring pattern on the printed circuit board and the lead terminal of the connector body is electrically connected to each other through the conductive path on the flexible member. Therefore, the soldered portions of the flexible member and the printed circuit board are not easily separated from each other by externally applied stresses, resulting in high reliability of the soldered portions. Even when the number of the lead terminal of the connector body is increased, a pitch of the conductive path on the flexible member can be increased, resulting in improved yield of soldering.

BRIEF DESCRIPTION OF THE DRAWINGS

Other objects and features of the present invention will become more readily apparent from a better understanding of the preferred embodiments described below with reference to the following drawings, in which.

DETAILED DESCRIPTION OF THE PREFERRED EMBODIMENTS (First Embodiment)

A first preferred embodiment of the present invention is explained with reference to appended drawings below. A surface-mounted type connector in the present embodiment is used for a circuit device of an automotive electronic control unit. The connector is a multi-way type and complies with improved functionality of the electronic control unit.

Figure 1:
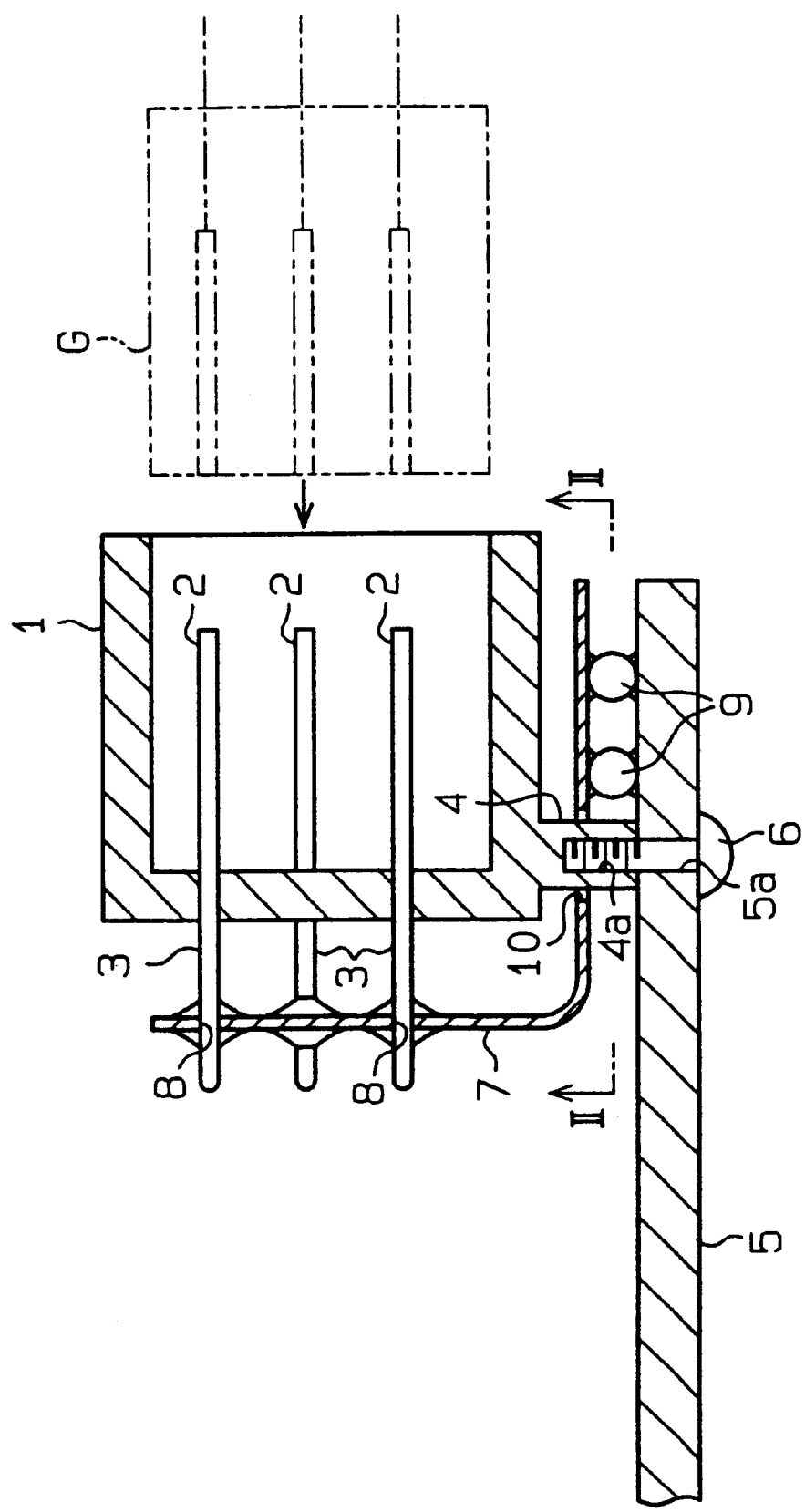
FIG. 1 is a cross-sectional view showing a circuit device including a surface-mounted type connector in a first preferred embodiment of the present invention.

Referring to FIG. 1, the connector has a connector body 1 made of resin and shaped into a rectangular box. The connector body 1 is open at a right side in FIG. 1 to detachably receive an opposite connector G in a direction indicated by an arrow in FIG. 1. Plural connection terminals 2 for external connection are disposed within the connector body 1, and plural lead terminals 3 extend from the respective connection terminals 2. The lead terminals 3 are taken out from the connector body 1.

The connector body 1 integrally has several leg portions 4 as extending portions at a bottom wall thereof, and is fixed to a printed circuit board 5 by the leg portions 4. Specifically, two or three leg portions 4 are disposed in a longitudinal direction of the connector body 1 (in a direction perpendicular to the paper space of FIG. 1). Each of the leg portions 4 has a screw hold 4a. The printed circuit board 5 has holes 5a at portions corresponding to the leg portions 4. The connector body 1 is fixed to the printed circuit board 5 by inserting screws 6 into the screw holes 4a of the leg portions 4 through the holes 5a of the printed circuit board 5.

A flexible member 7 is a film plate made of, for example, polyimide resin. A copper foil is adhered to the film plate, and is etched into a specific shape. Accordingly, conductive paths having the specific shape are formed on the flexible member 7. Plural through holes 8 are formed in the flexible member 7, and the lead terminals 3 are inserted into the through holes 8, respectively. The lead terminals 3 are fixed to the flexible member 7 by soldering.

The flexible member 7 is further fixed to the printed circuit board 5 with a ball grid array (BGA) form. Specifically, the flexible member 7 has a free end portion extending downwardly from the portion where the lead terminals 3 are soldered, and the free end portion is bent to be disposed between the bottom wall of the connector body 1 and the printed circuit board 5. The flexible member 7 is soldered to the printed circuit board 5 by solder balls 9, which are arranged into a latticed shape between the flexible member 7 and the printed circuit board 5. Accordingly, the conductive paths of the flexible member 7 are electrically connected to a wiring pattern on the printed circuit board 5. The solder balls 9 are disposed on the copper pattern forming the conductive paths of the flexible member 7, and are welded onto the printed circuit board 5 by a reflow treatment.

Figure 2:
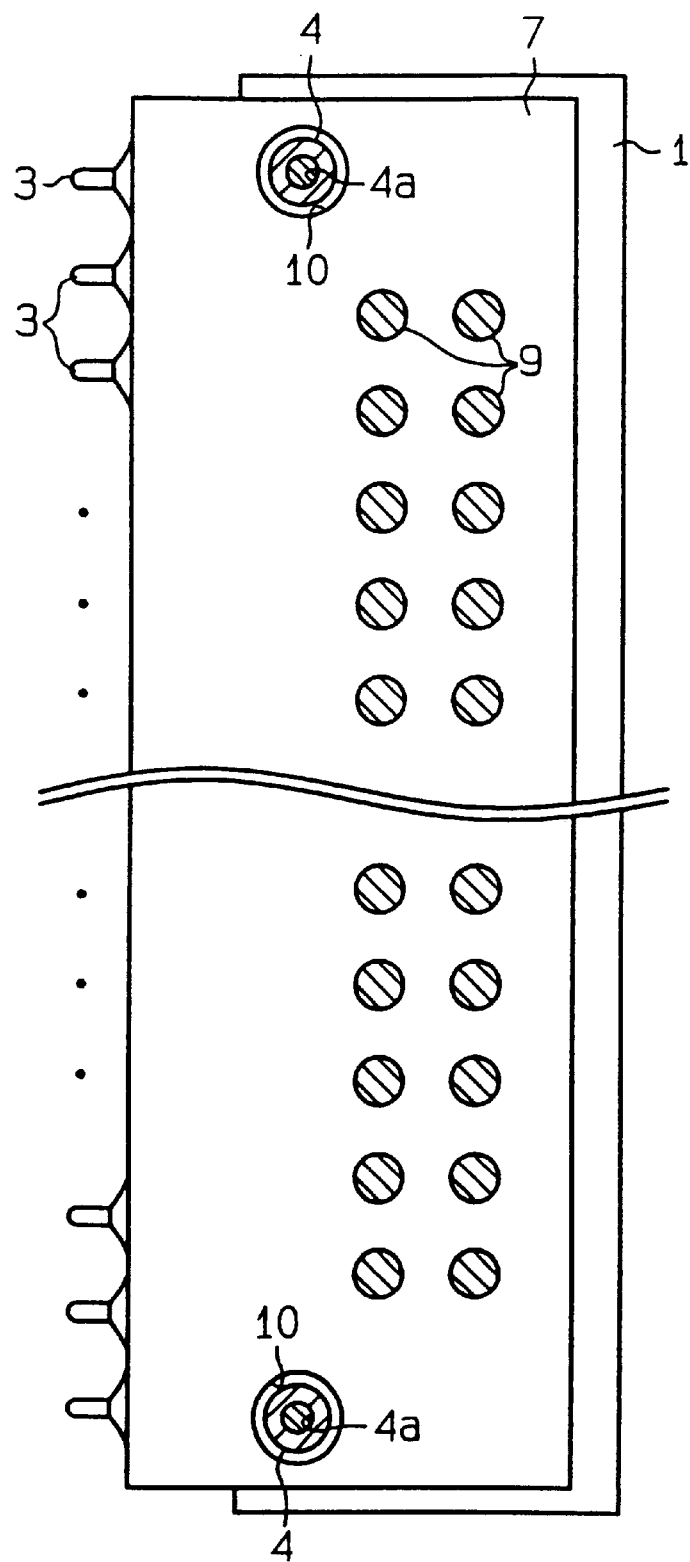
FIG. 2 is a cross-sectional view taken along a line II—II line in FIG. 1.

The flexible member 7 has through holes 10, and the leg portions 4 of the connector body 1 are inserted into the through holes 10. Referring to FIG. 2 showing a cross-section taken along a line II—II in FIG. 1, the leg portions 4 are provided at two portions close to both ends of the connector body 1 in the longitudinal direction. The through holes 10 are formed to correspond to the positions and dimensions of the leg portions 4. Each of the through holes 10 has a diameter slightly larger than an outer diameter of each of the leg portions 4 to define a clearance of, for example, approximately 0.1 mm.

A method for producing the circuit device described above is explained below. First, the connector body 1 assembled with the lead terminals 3, the flexible member 7 holding the solder balls 9 with a specific pattern, and the printed circuit board 5 are prepared, respectively. The lead terminals 3 protruding from the connector body 1 are inserted into the through holes 8 of the flexible member 7, and the lead terminals 3 are fixed to the flexible member 7 by soldering. Next, the free end portion of the flexible member 7 is bent toward the bottom wall of the connector body 1, and the leg portions 4 are inserted into the through holes 10 provided in the free end portion.

In this state, the leg portions 4b are disposed on the printed circuit board 5. The screws 6 are screwed into the screw holes 4a through the holes 5a, so that the connector body 1 are screwed to the printed circuit board 5. The free end portion of the flexible member 7 is positioned by the screw fixation step described above, and accordingly, the solder balls 9 are positioned with respect to the wiring pattern on the printed circuit board 5 at high accuracy. After that, the flexible member 7 is soldered to the printed circuit board 5 by performing a soldering reflow treatment, thereby completing the circuit device shown in FIG. 1.

According to the present embodiment described above, the following effects can be provided.

(1) The through holes 10 are formed in the flexible member 7 at portions close to the soldered portions (BGA portions) of the flexible member 7, and the leg portions 4 of the connector body 1 is inserted into the through holes 10 of the flexible member 7. Accordingly, the positioning of the soldered portions (BGA portions) of the flexible member 7 can be performed readily and accurately, and the mounting workability for mounting the connector body 1 to the printed circuit board 5.

(2) The connector body 1 is electrically connected to the printed circuit board 5 through the flexible member 7. The soldered portions (BGA portions) do not receive directly a stress generated when the opposite connector G is attached to or detached from the connector body 1, and a stress generated by vibrations and the like. As a result, the reliability of the soldered portions is improved. In practice, the soldered portions are hardly separated from each other even in cases where the connector is automatically detached when the electronic control device is checked, vibrations occur when the circuit device is mounted on a vehicle, and the like.

(3) Because the flexible member 7 is positioned utilizing the leg portions 4 of the connector body 1, it is not necessary to use additional members for the positioning, resulting in the simplified structure of the circuit device.

(4) The BGA form is adopted to solder the flexible member 7 and the printed circuit board 5 together. Therefore, even when the conductive paths are formed on the flexible member 7 with a decreased pitch to be used for a multi way connector, the yield of soldering is elevated. Further, the BGA form improves a self-alignment performance when mounting, and can absorb a positional deviation to some extent occurring when the connector body 1 is screwed to the printed circuit board 5. Furthermore, the mounting workability of the connector body is easy even when the number of the lead terminal is increased, because the pitch of the solder balls 9 arranged into a latticed shape needs not be increased.

(5) The leg portions 4 provided at the portions close to both ends in the longitudinal direction of the connector body 1 can prevent distortion of the connector body 1 and the printed circuit board 5 when there is a difference in thermal expansion coefficient between the connector body 1 and the printed circuit board 5. Therefore, the soldered portions are not easily separated from each other by the thermal distortions even when the automotive electronic control unit including the circuit device in the present embodiment is operated under harsh environment accompanied by a large change in temperature.

(Second Embodiment)

A second preferred embodiment of the present invention is explained focusing on differences from the first embodiment. In the second embodiment, the same parts and components as those in the first embodiment are assigned to the same reference numerals.

Figure 3:
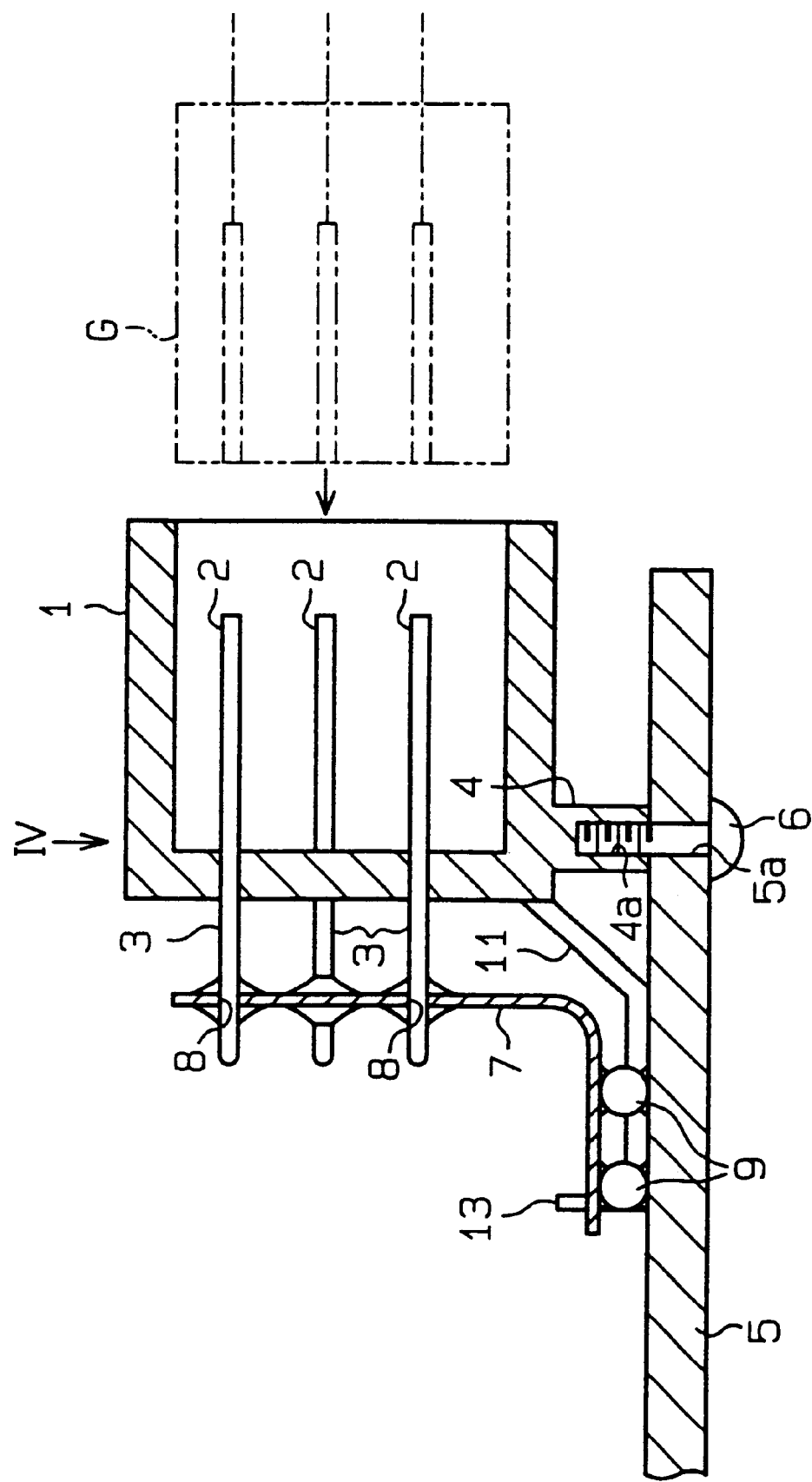
FIG. 3 is a cross-sectional view showing a circuit device including a surface-mounted type connector in a second preferred embodiment of the present invention.
Figure 4:
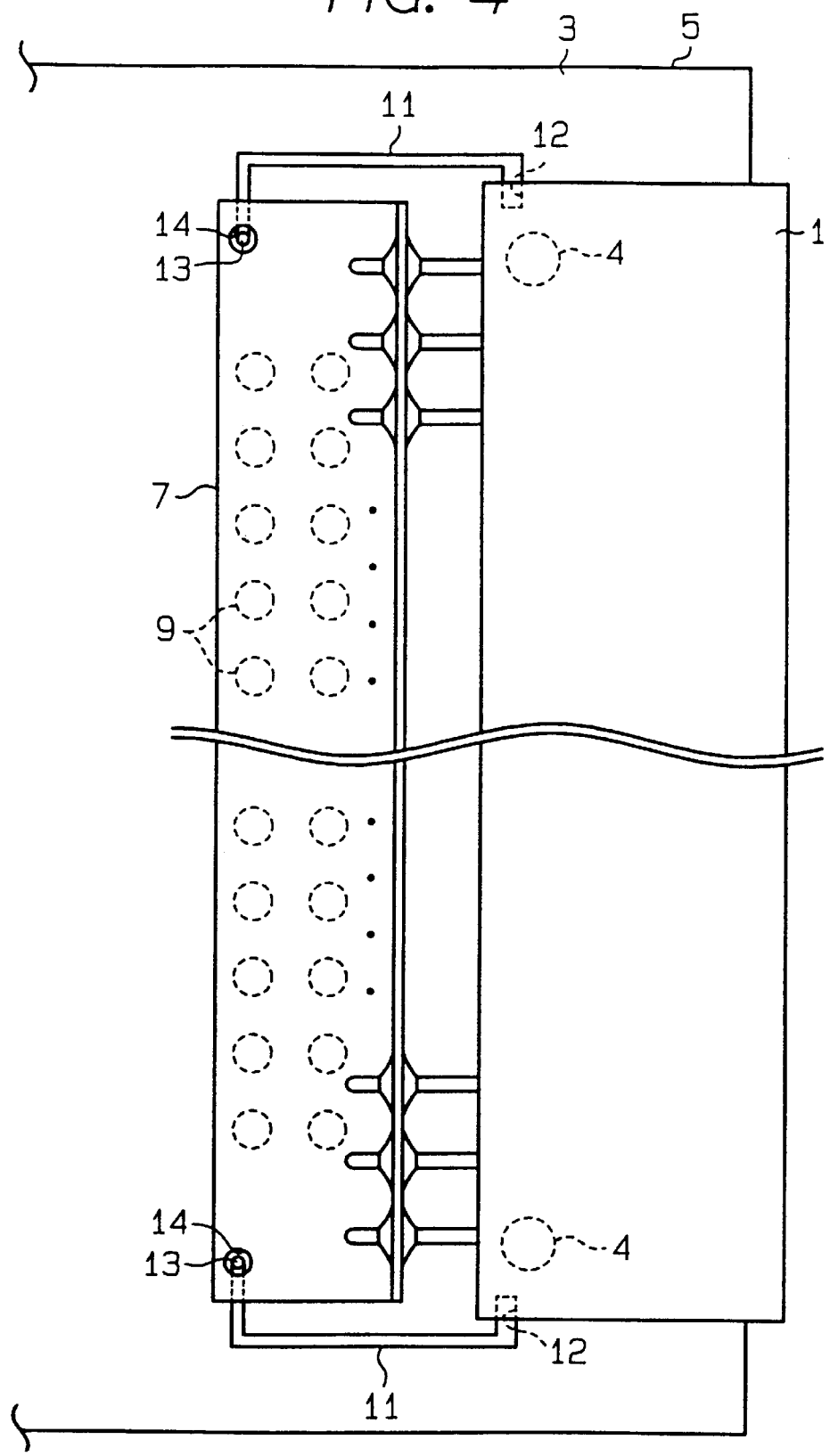
FIG. 4 is a plan view showing the circuit device in a direction indicated by an arrow IV in FIG. 3.

Referring to FIGS. 3 and 4, the free end portion of the flexible member 7 extending downward from the joining portion with the lead terminals 3 is bent along the printed circuit board 5, and is fixed to the printed circuit board 5 at an opposite side of the connector body 1 with the BGA form. The conductive paths of the flexible member 7 and the wiring pattern of the printed circuit board 5 are electrically connected to each other through the solder balls 9 arranged into a latticed shape between the flexible member 7 and the printed circuit board 5 as in the first embodiment.

Two stays 11 attached to the connector body 1 and extending therefrom position the free end portion of the flexible member 7. Specifically, as shown in FIG. 4, the connector body 1 has two recesses 12, and base end portions of the stays 11 are fitted in the recesses 12, respectively. Front end portions of the stays 11 extend to face both sides of the flexible member 7. The front end portions of the stays 11 have positioning pins 13, respectively, and the positioning pins 13 are inserted into through holes 14 provided in the flexible member 7. Each of the through holes 14 has a diameter slightly larger than the outer diameter of the pins 13 so that a specific clearance (for example, 0.1 mm) is defined between each through hole 14 and each pin 13. Accordingly, the free end portion of the flexible member 7 can be positioned readily and accurately, so that the solder balls 9 on the flexible member 7 are positioned on the wiring pattern of the printed circuit board 5 accurately.

Next, a procedure for producing the circuit device shown in FIGS. 3 and 4 is explained below. First, as explained in the first embodiment referring to FIGS. 1 and 2, the connector body 1 assembled with the lead terminals 3, the flexible member 7 holding the solder balls 9 arranged into a specific pattern thereon, and the printed circuit board 5 are prepared, respectively. The stays 11 are attached to the connector body 1 at this stage.

The lead terminals 3 extending from the connector body 1 are inserted into the respective through holes 8 of the flexible member 7, and are fixed to the flexible member 7 by soldering. Next, the free end portion of the flexible member 7 is bent toward the side opposite to the connector body 1, and then, the positioning pins 13 of the stays 11 are inserted into the through holes 14 provided in the free end portion. In this state, the screws 6 are screwed into the screw holes 4a of the leg portions 4 through the holes 5a of the printed circuit board 5 so that the connector body 1 is screwed to the printed circuit board 5. The plural solder balls 9 are positioned on the wiring pattern on the printed circuit board 5 at high accuracy by the screw fixation step. After that, the flexible member 7 and the printed circuit board 5 are soldered together by a soldering reflow treatment, thereby completing the circuit device shown in FIG. 3.

According to the second embodiment described above, the same effects as those in the first embodiment are realized. For example, the mounting workability is easy, the reliability of soldered portions (BGA portions) is improved, and the number of the lead terminals of the connector can be increased. In addition, according to the second embodiment, the flexible member 7 bent in an arbitrary direction can be positioned on the printed circuit board 5 readily and accurately by changing the direction in which the stays 11 extend. For example, the stays 11 may extend toward the connector body 1 (under the connector body 1) at a side opposite to that in FIGS. 3 and 4.

While the present invention has been shown and described with reference to the foregoing preferred embodiments, it will be apparent to those skilled in the art that changes in form and detail may be made therein without departing from the scope of the invention as defined in the appended claims.

For example, in the embodiments described above, two or three leg portions 4 are provided at the bottom wall of the connector body 1. However, the number of the leg portions 4 is not limited to that, but may be one or more than three. The positions where the leg portions 4 are provided are also arbitrary changeable, and can be determined in consideration of the assembling strength of the connector and the like.

The circuit device shown in FIGS. 3 and 4 can dispense with the leg portions 4 of the connector body 1 when the thickness of the bottom wall of the connector body 1 is increased so that screw holes are formed in the bottom wall directly. In this case, the connector body 1 is screwed to the printed circuit board 5 by inserting the screws into the screw holes. The flexible member 7 is positioned by the stays 11 as well. As a result, the same effects described above can be provided.

In the embodiments described above, the solder balls 9 are arranged on the flexible member 7 with the latticed shape to adopt the BGA form. However, the solder balls 9 may be arranged with another shape such as a staggered shape, a line, or the like. The solder balls 9 may be disposed on the printed circuit board 5 instead of on the flexible member 7 to undergo the reflow treatment.

The present invention is especially effective to multi way connectors, but is not limited to those. The present invention is also applicable to circuit devices not adopting the BGA form.

What is claimed is:

1. A surface-mounted type connector for being surface-mounted on a circuit member, the connector comprising:
    a flexible member holding a conductive path thereon and having a specific portion for being soldered to the circuit member, the specific portion having a through hole; and
    a connector body having a lead terminal protruding therefrom and fixed to the flexible member to be electrically connected to the conductive path, and an extending portion protruding therefrom to be inserted into the through hole of the specific portion to both fix the connector body to the circuit member and determine a position of the flexible member with respect to the circuit member.

2. The surface-mounted type connector of claim 1, wherein the specific portion holds a plurality of solder balls thereon for being soldered to the circuit member by the solder balls.

3. The surface-mounted type connector of claim 1, wherein:
    the extending portion is a leg portion for fixing the connector body to the circuit member; and
    the specific portion of the flexible member, with the through hole into which the extending portion is inserted, is disposed between the connector body and the circuit member when the connector body is mounted to the circuit member.

4. A surface-mounted type connector for being surface-mounted on a circuit member, the connector comprising:
    a flexible member holding a conductive path thereon and having a specific portion for being soldered to the circuit member, the specific portion having a through hole; and
    a connector body having a lead terminal protruding therefrom and fixed to the flexible member to be electrically connected to the conductive path, and an extending portion protruding therefrom to be inserted into the through hole of the specific portion, wherein
    the extending portion is a leg portion for fixing the connector body to the circuit member;
    the specific portion of the flexible member, with the through hole into which the extending portion is inserted, is disposed between the connector body and the circuit member when the connector body is mounted to the circuit member, and wherein the leg portion has a screw hole therein in to which a screw is to be inserted for fixing the connector body to the circuit member.

5. A surface-mounted type connector for being surface-mounted on a circuit member, the connector comprising:
   a flexible member holding a conductive path thereon and having a specific portion for being soldered to the circuit member, the specific portion having a through hole; and
   a connector body having a lead terminal protruding therefrom and fixed to the flexible member to be electrically connected to the conductive path, and an extending portion protruding therefrom to be inserted into the through hole of the specific portion, wherein:
      the extending portion is a stay having a positioning pin at a front end thereof; and
      the positioning pin is inserted into the through hole of the flexible member.

6. A method for producing a circuit device comprising:
   preparing a connector body and a flexible member, the connector body having a lead terminal and an extending portion protruding therefrom, the flexible member having a first portion holding a conductive path thereon and a second portion extending from the first portion and having a through hole therein;
   fixing the lead terminal to the first portion of the flexible member so that the lead terminal is electrically connected to the conductive path;
   inserting the extending portion of the connector body into the through hole of the flexible member;
   fixing the extending portion of the connector body to a printed circuit board having a wiring pattern thereon to thereby fix the connector body to the printed circuit board and determine a position of the flexible member with respect to the circuit board; and
   electrically connecting the conductive path on the flexible member to the wiring pattern on the printed circuit board.

7. The method for claim 6, wherein inserting the extending portion of the connector body into the through hole of the flexible member includes:
   bending the flexible member so that the second portion is disposed between the connector body and the printed circuit board; and
   inserting the extending portion into the through hole of the second portion.

8. A method for producing a circuit device comprising:
   preparing a connector body and a flexible member, the connector body having a lead terminal and an extending portion protruding therefrom, the flexible member having a first portion holding a conductive path thereon and a second portion extending from the first portion and having a through hole therein;
   fixing the lead terminal to the first portion of the flexible member so that the lead terminal is electrically connected to the conductive path;
   inserting the extending portion of the connector body into the through hole of the flexible member;
   fixing the connector body to a printed circuit board having a wiring pattern thereon; and
   electrically connecting the conductive path on the flexible member to the wiring pattern on the printed circuit board, wherein the connector body is fixed to the printed circuit board by fixing the extending portion to the printed circuit board, wherein fixing the connector body to the printed circuit board includes inserting a screw into a screw hole defined in the extending portion of the connector body through a hole in the printed circuit board.

9. The method of claim 6, wherein the conductive path on the flexible member and the wiring pattern on the printed circuit board are electrically connected to one another by a plurality of solder balls disposed between the printed circuit board and the flexible member.

10. The method for claim 9, wherein the plurality of solder balls are arranged on the second portion of the flexible member before fixing the lead terminal to the flexible member.

11. A method for producing a circuit device comprising:
   preparing a connector body and a flexible member, the connector body having a lead terminal and an extending portion protruding therefrom, the flexible member having a first portion holding a conductive path thereon and a second portion extending from the first portion and having a through hole therein;
   fixing the lead terminal to the first portion of the flexible member so that the lead terminal is electrically connected to the conductive path;
   inserting the extending portion of the connector body into the through hole of the flexible member;
   fixing the connector body to a printed circuit board having a wiring pattern thereon; and
   electrically connecting the conductive path on the flexible member to the wiring pattern on the printed circuit board, wherein:
      the extending portion is a stay having a positioning pin at a front end thereof; and
      the positioning pin is inserted into the through hole of the flexible member.

12. A circuit device comprising:
   a printed circuit board having a wiring pattern thereon;
   a flexible member holding a conductive path and having a specific portion soldered to the printed circuit board so that the conductive path is electrically connected to the wiring pattern, the specific portion having a through hole; and
   a connector surface-mounted on the printed circuit, the connector comprising:
      a connector body;
      a portion protruding from the connector body, inserted into the through hole of the flexible member, and secured to the printed circuit board to secure the connector body to the printed circuit board and determine a position of the flexible member with respect to the printed circuit board; and
      a lead terminal protruding from the connector body and fixed to the flexible member to be electrically connected to the wiring pattern of the printed circuit board through the conductive path of the flexible member.

13. The circuit device of claim 12, wherein:
   the connector body has a first wall facing the printed circuit board;
   the portion protrudes from the first wall toward the printed circuit board; and
   the specific portion of the flexible member is disposed between the connector body and the printed circuit board with the through hole into which the portion is inserted.

14. The circuit device of claim 13, wherein:
   the connector body has a second wall non-parallel to the first wall;
   the lead terminal protrudes from the second wall; and
   the flexible member is bent to extend along the first wall and the second wall.

15. A circuit device comprising:
a printed circuit board having a wiring pattern thereon;
a flexible member holding a conductive path and having a specific portion soldered to the printed circuit board so that the conductive path is electrically connected to the wiring pattern, the specific portion having a through hole;
a connector surface-mounted on the printed circuit, the connector comprising:
a connector body;
a portion protruding from the connector body, inserted into the through hole of the flexible member;
a lead terminal protruding from the connector body and fixed to the flexible member to be electrically connected to the wiring pattern of the printed circuit board through the conductive path of the flexible member, and
a screw inserted into a hole defined in the printed circuit board and a screw hole defined in the extending portion of the connector body so that the connector body is fixed to the printed circuit board.

16. A circuit device comprising:
a printed circuit board having a wiring pattern thereon;
a flexible member holding a conductive path and having a specific portion soldered to the printed circuit board so that the conductive path is electrically connected to the wiring pattern, the specific portion having a through hole;
a connector surface-mounted on the printed circuit, the connector comprising:
a connector body;
a portion protruding from the connector body, inserted into the through hole of the flexible member; and
a lead terminal protruding from the connector body and fixed to the flexible member to be electrically connected to the wiring pattern of the printed circuit board through the conductive path of the flexible member, wherein:
the portion is a stay extending from the connector body and having a positioning pin at a front end thereof for positioning the flexible member; and
the positioning pin is inserted into the through hole of the flexible member.

17. A surface-mounted type connector for being surface-mounted on a circuit member, the connector comprising:
a flexible member having a conductive path thereon and having a specific portion for being soldered to the circuit member, the specific portion having at least one through hole; and
a connector body having a lead terminal protruding therefrom and fixed to the flexible member to be electrically connected to the conductive path, and at least one extending portion protruding therefrom to be respectively inserted into the at least one through hole of the specific portion and directly secured to the circuit member, the connector body being directly secured to the circuit member solely with said at least one extending portion.

18. A method for producing a circuit device comprising:
preparing a connector body and a flexible member, the connector body having a lead terminal and at least one extending portion protruding therefrom, the flexible member having a first portion holding a conductive path thereon and a second portion extending from the first portion and having at least one through hole therein;
fixing the lead terminal to the first portion of the flexible member so that the lead terminal is electrically connected to the conductive path;
inserting the at least one extending portion of the connector body respectively into the at least one through hole of the flexible member;
fixing the connector body to a printed circuit board having a wiring pattern thereon, so that the connector body is directly fixed to the circuit member solely by said at least one extending portion extending respectively through said at least one through hole; and
electrically connecting the conductive path on the flexible member to the wiring pattern on the printed circuit board.

19. A circuit device comprising:
a printed circuit board having a wiring pattern thereon;
a flexible member holding a conductive path and having a specific portion soldered to the printed circuit board so that the conductive path is electrically connected to the wiring pattern, the specific portion having a through hole; and
a connector surface-mounted on the printed circuit, the connector comprising:
a connector body;
at least one portion protruding from the connector body, inserted into the through hole of the flexible member, and secured to the printer circuit board so that the connector body is directly secured to the printed circuit board solely by said at least one portion; and
a lead terminal protruding from the connector body and fixed to the flexible member to be electrically connected to the wiring pattern of the printed circuit board through the conductive path of the flexible member.

* * * * *